(12) United States Patent
Min et al.

(10) Patent No.: US 7,248,075 B2
(45) Date of Patent: Jul. 24, 2007

(54) LEVEL SHIFTER WITH LOW LEAKAGE CURRENT

(75) Inventors: Young-Sun Min, Seoul (KR); Nam-Jong Kim, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 142 days.

(21) Appl. No.: 11/020,252

(22) Filed: Dec. 27, 2004

(65) Prior Publication Data
US 2006/0028245 A1 Feb. 9, 2006

(30) Foreign Application Priority Data
Aug. 9, 2004 (KR) ...................... 10-2004-0062400

(51) Int. Cl.
*H03K 19/0175* (2006.01)
*H03L 5/00* (2006.01)
(52) U.S. Cl. ........................... 326/80; 326/73; 326/74; 327/333
(58) Field of Classification Search ............. 326/68–69, 326/73–74, 77–78, 80–84, 86, 115, 127; 327/108–109, 333
See application file for complete search history.

(56) References Cited

U.S. PATENT DOCUMENTS

| | | | | |
|---|---|---|---|---|
| 5,241,225 A | * | 8/1993 | Okajima et al. | 326/73 |
| 5,387,828 A | * | 2/1995 | Nakano | 326/68 |
| 5,723,986 A | * | 3/1998 | Nakashiro et al. | 326/81 |
| 5,900,745 A | * | 5/1999 | Takahashi | 326/64 |
| 6,043,699 A | * | 3/2000 | Shimizu | 327/333 |
| 6,100,716 A | * | 8/2000 | Adham et al. | 326/68 |
| 6,118,318 A | * | 9/2000 | Fifield et al. | 327/206 |
| 6,121,793 A | * | 9/2000 | Pickering et al. | 326/73 |
| 6,294,932 B1 | * | 9/2001 | Watarai | 326/83 |
| 6,323,683 B1 | * | 11/2001 | Katikaneni | 326/66 |
| 6,373,283 B2 | * | 4/2002 | Matsumoto | 326/68 |
| 6,853,217 B2 | * | 2/2005 | Tanaka et al. | 326/68 |
| 6,956,400 B2 | * | 10/2005 | Ilchmann | 326/66 |

* cited by examiner

*Primary Examiner*—Rexford Barnie
*Assistant Examiner*—Jason Crawford
(74) *Attorney, Agent, or Firm*—Volentine & Whitt, PLLC

(57) ABSTRACT

A voltage level shift circuit includes a first stage which receives an input signal having voltage levels Vcc and Vss, where Vcc>Vss, and which outputs complementary first and second intermediate signals, wherein the complementary first and second intermediate signals have voltage levels $VI_{high}$ and $VI_{low}$, where $VI_{high}>VI_{low}$; and a second stage which receives the first and second intermediate signals, and which outputs complementary first and second output signals, wherein the complementary first and second output signals have voltage levels $VO_{high}$ and $VO_{low}$, where $VO_{high}>VO_{low}$, wherein $VI_{high}>VO_{high}$ or $VI_{low}<VOlow$, and wherein $VO_{high}>Vcc$ and $VO_{low}<Vss$.

21 Claims, 17 Drawing Sheets

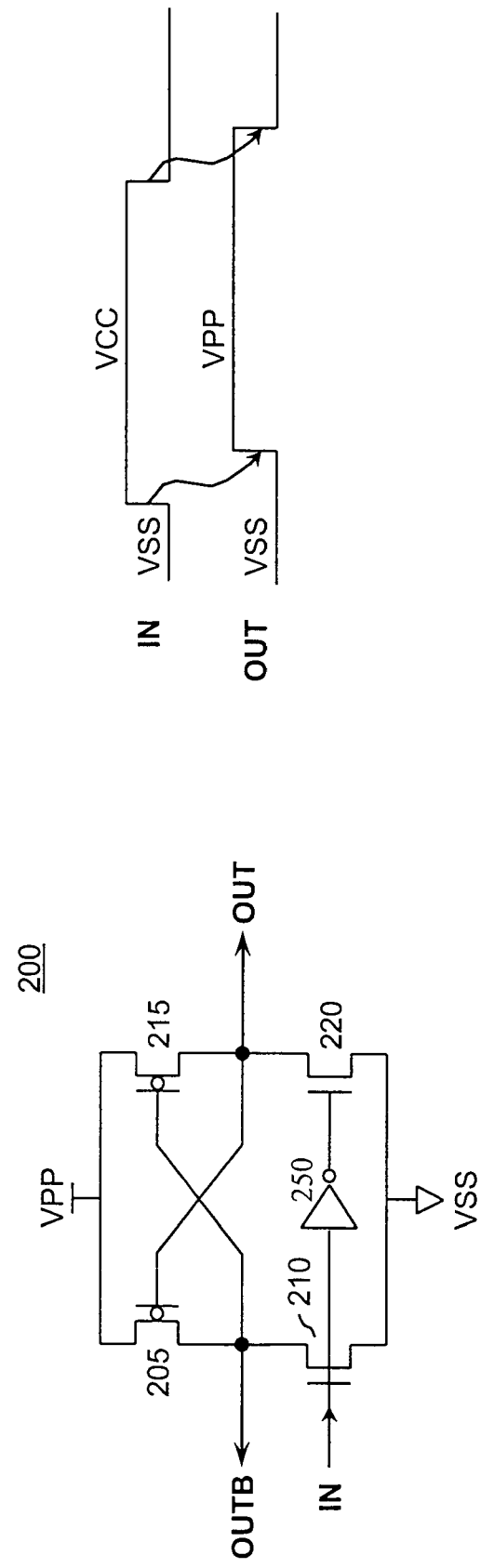

LEVEL SHIFTER WITH LOW LEAKAGE CURRENT

BACKGROUND OF THE INVENTION

1. Field of the Invention

This invention generally pertains to the field of level shifter circuits, and more particularly, to level shifter circuits with low leakage current.

2. Description of the Related Art

FIG. 1 is a block diagram of an arrangement of two circuits 110, 120 that operate with different supply voltage levels. The first circuit 110 operates between voltage levels Vcc and Vss, and outputs a signal $V_{SIG}$ that also has voltage levels between Vcc and Vss. The second circuit 120, which receives the signal $V_{SIG}$, operates between two different voltage levels VPP and VBB (e.g., VPP>Vcc and VBB<Vss).

If the circuits 110 and 120 are connected directly together as shown in FIG. 1, then one or both circuits will exhibit an undesirably high leakage current when active. This in turn increases the power consumption of the arrangement, and any electronic device or system (e.g., a memory device) including the arrangement.

Accordingly, to address this problem, level shifters are often interposed between two circuits that operate with different supply voltage levels. In the example of FIG. 1, both a high level and low level shifter are needed between the output of the first circuit 110 and the input of the second circuit 120.

FIG. 2A shows a conventional high level shifter 200. The level shifter 200 receives an input signal IN which has two voltage levels Vcc and Vss and outputs complementary first and second output signals OUT and OUTB having voltage levels VPP and Vss, where VPP>Vcc.

The voltage shifter 200 includes pull-up transistors 205 and 215, pull-down transistors 210 and 220, and inverter 250. Explanation of the various connections between the transistors 205, 210, 215 and 220 and inverter 250 is omitted for brevity as those connections can be easily seen and understood from inspection of FIG. 2A.

FIG. 2B shows the input and output signals IN and OUT of the high level shifter 200. Operation of the high level shifter 200 is explained with respect to FIG. 2B.

When the input signal IN has the low voltage level Vss, then the pull-down transistor 210 is turned off, while the pull-down transistor 220 is turned on, pulling the output signal OUT low, approximately down to Vss. The output signal OUT going low, in turn, turns-on the pull-up transistor 205, pulling the inverted output signal OUTB high, approximately up to VPP. Meanwhile, the inverted output signal OUTB going high, in turn, turns-off the pull-up-transistor 215, insuring that the output signal OUT remains low.

On the other hand, when the input signal IN has the high voltage level Vcc, then the pull-down transistor 210 is turned on, pulling the inverted output signal OUTB low, approximately down to Vss, while the pull-down transistor 220 is turned off. The inverted output signal OUTB going low, in turn, turns-on the pull-up transistor 215, pulling the output signal OUT high, approximately up to VPP. Meanwhile, the output signal OUT going high, in turn, turns-off the pull-up-transistor 205, insuring that the inverted output signal OUTB remains low.

FIG. 3A shows a conventional low level shifter 300. The level shifter 300 receives an input signal IN which has two voltage levels Vcc and Vss and outputs complementary first and second output signals OUT and OUTB having voltage levels Vcc and VBB, where Vss>VBB. FIG. 3B shows the input and output signals IN and OUT of the low level shifter 300.

The connections and operation of the conventional low level shifter 300 are similar to those of the high level shifter 200 of FIG. 2A, and so for brevity will not be described in detail herein.

Unfortunately, the level shifters 200 and 300 suffer from an undesirably high leakage current. For example, in FIG. 2 when the input signal IN has the low voltage level Vss, then the Vgs of pull-down transistor 210 is 0 volts. However, even when Vgs=0 volts, a small leakage current may flow through the pull-down transistor 210.

U.S. Pat. No. 6,385,099 discloses another level shifter that exhibits reduced leakage current when in the standby mode. FIG. 4 shows an embodiment of the level shifter 300 disclosed in U.S. Pat. No. 6,385,099. The level shifter 400 is similar to the level shifter 200, with the difference being that the source of pull-down transistor 210 in FIG. 2 is tied to Vss, while the source of pull-down transistor 410 in FIG. 4 is tied to the output of inverter 450. Therefore, in the standby mode, when the input signal IN has the low voltage level Vss, the source of pull-down transistor 410 is tied to a higher voltage (e.g., VPP). Accordingly, the Vgs of pull-down transistor 410 is substantially negative, thereby substantially reducing the leakage current flowing therethrough in the standby mode, compared to the pull-down transistor 210 of FIG. 2.

However, the level shifter 400 still exhibits an undesirably high leakage current in the active mode.

Accordingly, it would be desirable to provide a level shifter that exhibits low leakage current in both a standby mode and an active mode. It would also be desirable to provide a level shifter with low leakage current that shifts both the high and low voltage levels.

SUMMARY OF THE INVENTION

In one aspect of the invention, a voltage level shift circuit comprises a first stage which receives an input signal having voltage levels Vcc and Vss, where Vcc>Vss, and which outputs complementary first and second intermediate signals, wherein the complementary first and second intermediate signals have voltage levels $VI_{high}$ and $VI_{low}$, where $VI_{high}$>$VI_{low}$; a second stage which receives the first and second intermediate signals, and which outputs complementary first and second output signals, wherein the complementary first and second output signals have voltage levels $VO_{high}$ and $VO_{low}$, where $VO_{high}$>$VO_{low}$; wherein $VI_{high}$>$VO_{high}$ or $VI_{low<VOlow}$, and wherein $VO_{high}$>Vcc and $VO_{low}$<Vss.

In another aspect of the invention, a voltage level shift circuit comprises a first PMOS transistor having a gate which receives an input signal having voltage levels Vcc and Vss, where Vcc>Vss, having a source connected to a first node, and having a drain connected to a first output node; an inverter having an input connected to the gate of the first PMOS transistor; a second PMOS transistor having a gate connected to an output of the inverter; having a source connected to a second node, and having a drain connected to a second output node; a first NMOS transistor having a gate connected to the drain of the second PMOS transistor, having a source connected to a first reference potential VBB, where VBB<Vss, and having a drain connected to the drain of the first PMOS transistor; and a second NMOS transistor having a gate connected to the drain of the first PMOS transistor, having a source connected to the first reference potential VBB, and having a drain connected to the drain of the second PMOS transistor, wherein at least one of (a) the second node is connected to the gate of the first PMOS transistor, and (b) the first node is connected to the gate of the second PMOS transistor.

In yet another aspect of the invention, a voltage level shift circuit comprises a first NMOS transistor having a gate which receives an input signal having voltage levels Vcc and Vss, where Vcc>Vss, having a source connected to a first node, and having a drain connected to a first intermediate output node; an inverter having an input connected to the gate of the first NMOS transistor and having an output connected to the first node; a second NMOS transistor having a gate connected to an output of the inverter, having a source connected to a second node, and having a drain connected to a second intermediate output node; a first PMOS transistor having a gate connected to the drain of the second NMOS transistor, having a source connected to a first reference potential VPP, where VPP>Vcc, and having a drain connected to the drain of the first NMOS transistor; a second PMOS transistor having a gate connected to the drain of the first NMOS transistor, having a source connected to the first reference potential VPP, and having a drain connected to the drain of the second NMOS transistor; a third PMOS transistor having a gate connected to the first intermediate output node, having a source connected to the first reference potential VPP, and having a drain connected to a first output node; a fourth PMOS transistor having a gate connected to the second intermediate output node, having a source connected to the first intermediate output node, and having a drain connected to a second output node; a third NMOS transistor having a gate connected to the drain of the fourth PMOS transistor, having a source connected to a second reference potential of VBB, where VBB<Vss, and having a drain connected to the drain of third PMOS transistor; and a fourth NMOS transistor having a gate connected to the drain of the third PMOS transistor, having a source connected to the second reference potential of VBB, and having a drain connected to the drain of fourth PMOS transistor.

In still another aspect of the invention, a level shifter comprises a first voltage level shift circuit which receives an input signal having voltage levels Vcc and Vss, where Vcc>Vss, and which outputs an intermediate signal having voltage levels $VI_{high}$ and $VI_{low}$, where $VI_{high}>VI_{low}$; and an second voltage level shift circuit which receives the intermediate signal from the first voltage level shift circuit, and which outputs an output signal having voltage levels $VO_{high}$ and $VO_{low}$, where $VO_{high}>VO_{low}$, wherein at least one of (a) $VI_{high}>VO_{high}$, and (b) $VI_{low}<VO_{low}$.

In a further aspect of the invention, a method of level shifting an input signal comprises receiving at a first stage of a level shift circuit an input signal having voltage levels Vcc and Vss, where Vcc>Vss; outputting from the first stage complementary first and second intermediate signals, wherein the complementary first and second intermediate signals have voltage levels $VI_{high}$ and $VI_{low}$, where $VI_{high}>V_{low}$; receiving at a second stage of the level shift circuit the first and second intermediate signals; and outputting from the second stage complementary first and second output signals, wherein the complementary first and second output signals have voltage levels $VO_{high}$ and $VO_{low}$, where $VO_{high}>VO_{low}$, wherein $VI_{high}>VO_{high}$ or $VI_{low}<VO_{low}$, and wherein $VO_{high}>Vcc$ and $VO_{low}<Vss$.

In a still further aspect of the invention, a method of generating a word line for a memory circuit comprises receiving at a level shift circuit an input signal having voltage levels Vcc and Vss, where Vcc>Vss; outputting from the level shift circuit a first intermediate signal, wherein the first intermediate signal has voltage levels $VI_{high}$ and $VI_{low}$, where $VI_{high}>VI_{low}$; receiving at a word line decoder the first intermediate signal; outputting from the word line decoder a second intermediate signal, wherein the second intermediate signal has voltage levels $VI_{high}$ and $VO_{low}$; receiving at a word line driver the second intermediate signal; outputting from the word line driver a word line signal, wherein the word line signal has voltage levels $VO_{high}$ and $VO_{low}$, where $VO_{high}>VO_{low}$, where $VI_{high}>VO_{high}$, where $V_{low}<VO_{low}$, and where $VO_{high}>Vcc$ and $VO_{low}<Vss$.

BRIEF DESCRIPTION OF THE DRAWINGS

FIG. 2A shows a conventional high level shifter;

FIG. 2B shows input and output signal waveforms of the level shifter of FIG. 2A;

DETAILED DESCRIPTION OF PREFERRED EMBODIMENTS

As used in the description and claims, the phrase "connected to" does not necessarily require direct connection between elements. Rather, for example, when an element A is said to be connected to an element B, this means that elements A and B are electrically connected such that electrical and/or logic characteristics of a signal transferred therebetween are substantially unaltered.

Figure 5B:
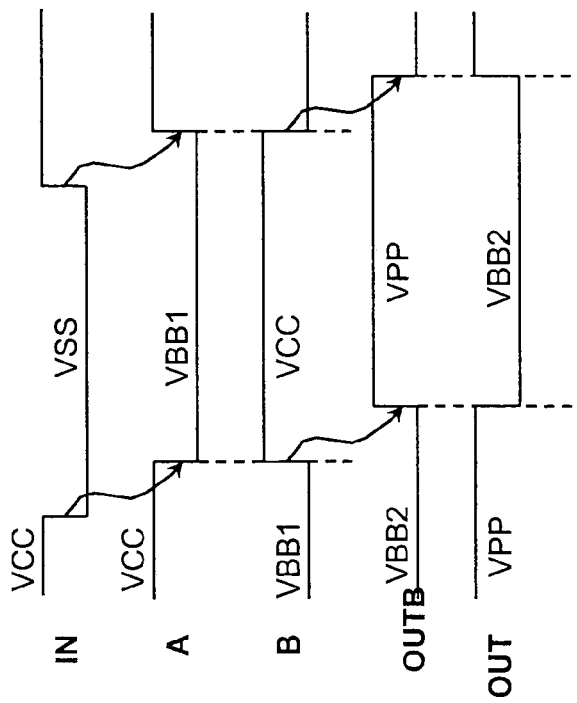
FIG. 5B shows input and output signal waveforms of the level shifter of FIG. 5A.
Figure 5A:
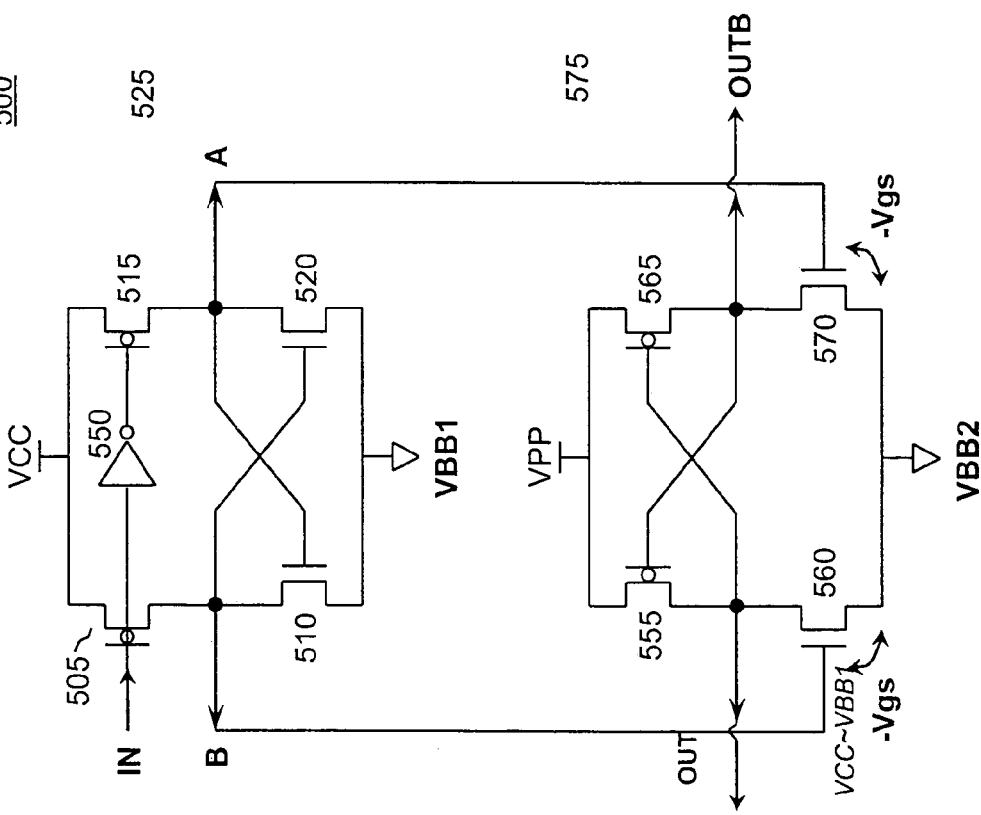
FIG. 5A shows a first embodiment of a two-stage level shifter exhibiting low leakage current.

FIG. 5A shows a first embodiment of a two-stage level shifter 500. The level shifter 500 receives an input signal IN which has two voltage levels Vcc and Vss and outputs complementary first and second output signals OUT and OUTB having voltage levels VPP ($VO_{high}$) and VBB2 ($VO_{low}$), where: VPP>Vcc; Vcc>Vss; and Vss>VBB2.

The level shifter 500 includes a first stage 525 and a second stage 575.

The first stage 525 includes pull-up (PMOS) transistors 505 and 515, pull-down (NMOS) transistors 510 and 520, and inverter 550. Explanation of the various connections between the transistors 505, 510, 515 and 520 and inverter 550 is omitted for brevity as those connections can be easily seen and understood from inspection of FIG. 5A. The first stage 525 receives the input signal IN having the two voltage levels Vcc and Vss and outputs complementary first and second intermediate signals A and B having voltage levels Vcc ($VI_{high}$) and VBB1 ($VI_{low}$), where: Vss>VBB1.

The second stage 575 includes pull-up (PMOS) transistors 555 and 565, and pull-down (NMOS) transistors 560 and 570. Explanation of the various connections between the transistors 555, 560, 565 and 570 is omitted for brevity as those connections can be easily seen and understood from inspection of FIG. 5A. The second stage 575 receives the intermediate signals A and B each of which has the two voltage levels Vcc and VBB1, and outputs the complementary first and second output signals OUT and OUTB having voltage levels VPP ($VO_{high}$) and VBB2 ($VO_{low}$), where VBB2>VBB1.

In other words, the voltage relationships in the two-stage level shifter 500 are as follows: VPP ($VO_{high}$)>Vcc ($VI_{high}$)>Vss>VBB2 ($VO_{low}$)>VBB1 ($VI_{low}$).

FIG. 5B shows the input, intermediate, and output signals IN, A, B, OUT and OUTB of FIG. 5A. Operation of the high level shifter 500 is explained with respect to FIG. 5B.

When the input signal IN has the high voltage level Vcc, then the pull-up transistor 505 is turned off, while the pull-up transistor 515 is turned on, pulling the intermediate signal A high, approximately up to Vcc. The intermediate signal A going high, in turn, turns-on the pull-down transistor 510, pulling the inverted intermediate signal B low, approximately down to VBB1. Meanwhile, the inverted intermediate signal B going low, in turn, turns-off the pull-down transistor 520, insuring that the intermediate signal A remains high.

On the other hand, when the input signal IN has the low voltage level Vss, then the pull-up transistor 515 is turned off, while the pull-up transistor 505 is turned on, pulling the inverted intermediate signal B high, approximately up to VCC. The inverted intermediate signal B going high, in turn, turns-on the pull-down transistor 520, pulling the intermediate signal A low, approximately down to VBB1. Meanwhile, the intermediate signal A going low, in turn, turns-off the pull-down transistor 510, insuring that the inverted intermediate signal B remains high.

When the intermediate signal A has the high voltage level Vcc (and the inverted intermediate signal B has the low voltage level VBB1), the pull-down transistor 560 is turned off, while the pull-down transistor 570 is turned on, pulling the inverted output signal OUTB low, approximately down to VBB2. The inverted output signal OUTB going low, in turn, turns-on the pull-up transistor 555, pulling the output signal OUT high, approximately up to VPP. Meanwhile, the output signal OUT going high, in turn, turns-off the pull-up transistor 565, insuring that the inverted output signal OUTB remains low.

On the other hand, when the intermediate signal A has the low voltage level VBB1 (and the inverted intermediate signal B has the high voltage level Vcc), then the pull-down transistor 570 is turned off, while the pull-down transistor 560 is turned on, pulling the output signal OUT low, approximately down to VBB2. The output signal OUT going low, in turn, turns-on the pull-up transistor 565, pulling the inverted output signal OUTB high, approximately up to VPP. Meanwhile, the inverted output signal OUTB going high, in turn, turns-off the pull-up transistor 555, insuring that the output signal OUT remains low.

Advantageously, VBB1 is more negative than VBB2 (i.e., VBB1<VBB2). Accordingly, when A is low (i.e., at VBB1), Vgs for the pull-down transistor 570 is negative (Vgs<0), thereby substantially reducing the leakage current flowing therethrough compared to a case where Vgs=0. Similarly, when B is low (i.e., at VBB1), Vgs for the pull-down transistor 560 is negative (Vgs<0), thereby substantially reducing the leakage current flowing therethrough compared to a case where Vgs=0.

Figure 6B:
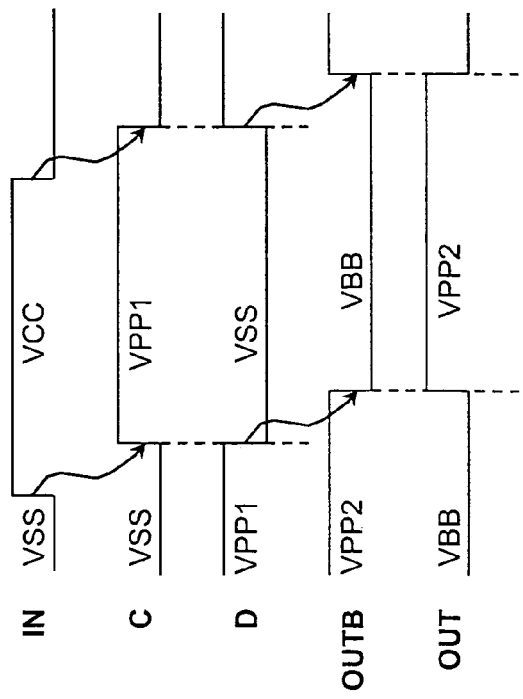
FIG. 6B shows input and output signal waveforms of the level shifter of FIG. 6A.
Figure 6A:
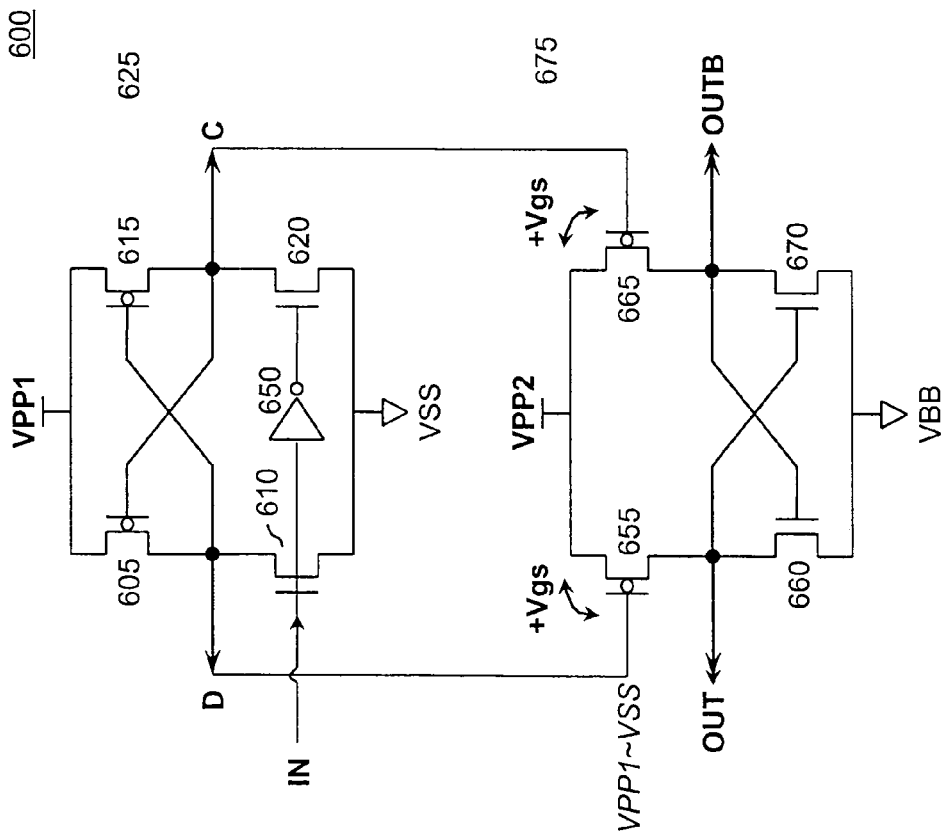
FIG. 6A shows a second embodiment of a two-stage level shifter exhibiting low leakage current.

FIG. 6A shows a second embodiment of a two-stage level shifter 600. The level shifter 600 receives an input signal IN which has two voltage levels Vcc and Vss and outputs complementary first and second output signals OUT and OUTB having voltage levels VPP2 ($VO_{high}$) and VBB ($VO_{low}$), where: VPP2>Vcc; Vcc>Vss; and Vss>VBB.

The level shifter 600 includes a first stage 625 and a second stage 675.

The first stage 625 includes pull-up (PMOS) transistors 605 and 615, pull-down (NMOS) transistors 610 and 620, and inverter 650. Explanation of the various connections between the transistors 605, 610, 615 and 620 and inverter 650 is omitted for brevity as those connections can be easily seen and understood from inspection of FIG. 6A. The first stage 625 receives the input signal IN having the two voltage levels Vcc and Vss and outputs complementary first and second intermediate signals A and B having voltage levels VPP1 ($VI_{high}$) and Vss ($VI_{low}$), where: VPP1>Vcc.

The second stage 675 includes pull-up (PMOS) transistors 655 and 665, and pull-down (NMOS) transistors 660 and 670. Explanation of the various connections between the transistors 655, 660, 665 and 670 is omitted for brevity as those connections can be easily seen and understood from inspection of FIG. 6A. The second stage 675 receives the intermediate signals A and B each of which has the two voltage levels VPP1 and Vss, and outputs the complementary first and second output signals OUT and OUTB having voltage levels VPP2 ($VO_{high}$) and VBB ($VO_{low}$), where VPP1>VPP2.

In other words, the voltage relationships in the two-stage level shifter 500 are as follows: VPP2 ($VO_{high}$)>VPP1 ($VI_{high}$)>Vcc>Vss ($VI_{low}$)>VBB ($VO_{low}$).

FIG. 6B shows the input, intermediate, and output signals IN, A, B, OUT and OUTB of FIG. 6A. Operation of the high level shifter 600 is explained with respect to FIG. 6B.

When the input signal IN has the low voltage level Vss, then the pull-down transistor 610 is turned off, while the pull-down transistor 620 is turned on, pulling the intermediate signal C low, approximately up to Vss. The intermediate signal C going low, in turn, turns-on the pull-up transistor 605, pulling the inverted intermediate signal D high, approximately up to VPP1. Meanwhile, the inverted intermediate signal D going high, in turn, turns-off the pull-up transistor 615, insuring that the intermediate signal C remains low.

On the other hand, when the input signal IN has the high voltage level Vcc, then the pull-down transistor 620 is turned off, while the pull-down transistor 610 is turned on, pulling the inverted intermediate signal D low, approximately down to Vss. The inverted intermediate signal D going low, in turn, turns-on the pull-up transistor 615, pulling the intermediate signal C high, approximately up to VPP1. Meanwhile, the intermediate signal C going high, in turn, turns-off the pull-up transistor 605, insuring that the inverted intermediate signal D remains low.

When the intermediate signal C has the low voltage level Vss (and the inverted intermediate signal D has the high voltage level VPP1), then the pull-up transistor 655 is turned off, while the pull-up transistor 665 is turned on, pulling the inverted output signal OUTB high, approximately up to VPP2. The inverted output signal OUTB going high, in turn, turns-on the pull-down transistor 660, pulling the output signal OUT low, approximately up to VBB. Meanwhile, the output signal OUT going low, in turn, turns-off the pull-down transistor 670, insuring that the inverted output signal OUTB remains high.

On the other hand, when the intermediate signal C has the high voltage level VPP1 (and the inverted intermediate signal D has the low voltage level Vss), then the pull-up transistor 665 is turned off, while the pull-down transistor 655 is turned on, pulling the output signal OUT high, approximately up to VPP2. The output signal OUT going high, in turn, turns-on the pull-down transistor 670, pulling the inverted output signal OUTB low, approximately down to VBB. Meanwhile, the inverted output signal OUTB going low, in turn, turns-off the pull-down transistor 660, insuring that the output signal OUT remains high.

Advantageously, VPP1 is more positive than VPP2 (i.e., VPP1>VPP2). Accordingly, when intermediate signal C is high (i.e., at VPP1), Vgs for the pull-up transistor 665 is positive (Vgs>0), thereby substantially reducing the leakage current flowing therethrough compared to a case where Vgs=0. Similarly, when inverted intermediate signal D is high (i.e., at VPP1), Vgs for the pull-up transistor 655 is positive (Vgs>0), thereby substantially reducing the leakage current flowing therethrough compared to a case where Vgs=0.

Figure 7:
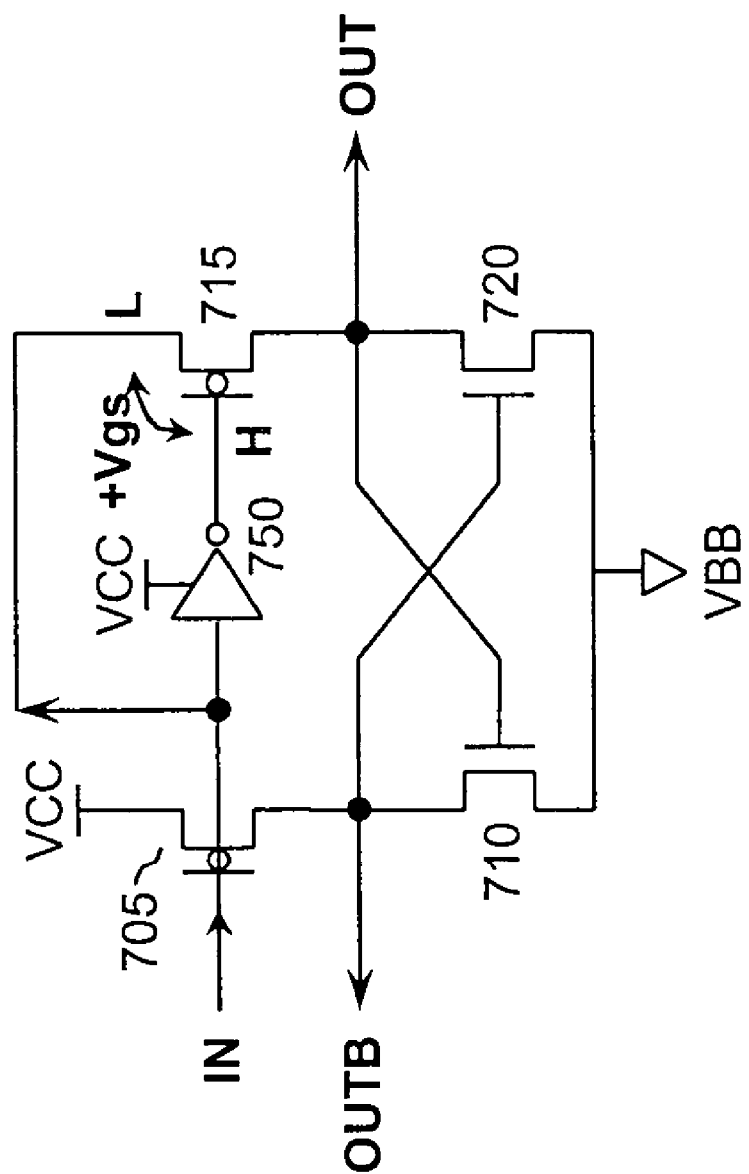
FIG. 7 shows a first embodiment of a one-stage level shifter exhibiting low leakage current.

FIG. 7 shows a first embodiment of a one-stage low level shifter 700. The level shifter 700 receives an input signal IN which has two voltage levels Vcc and Vss and outputs complementary first and second output signals OUT and OUTB having voltage levels Vcc and VBB, where VBB<Vss.

The voltage shifter 700 includes pull-up (PMOS) transistors 705 and 715, pull-down (NMOS) transistors 710 and 720, and inverter 750.

Figure 1:
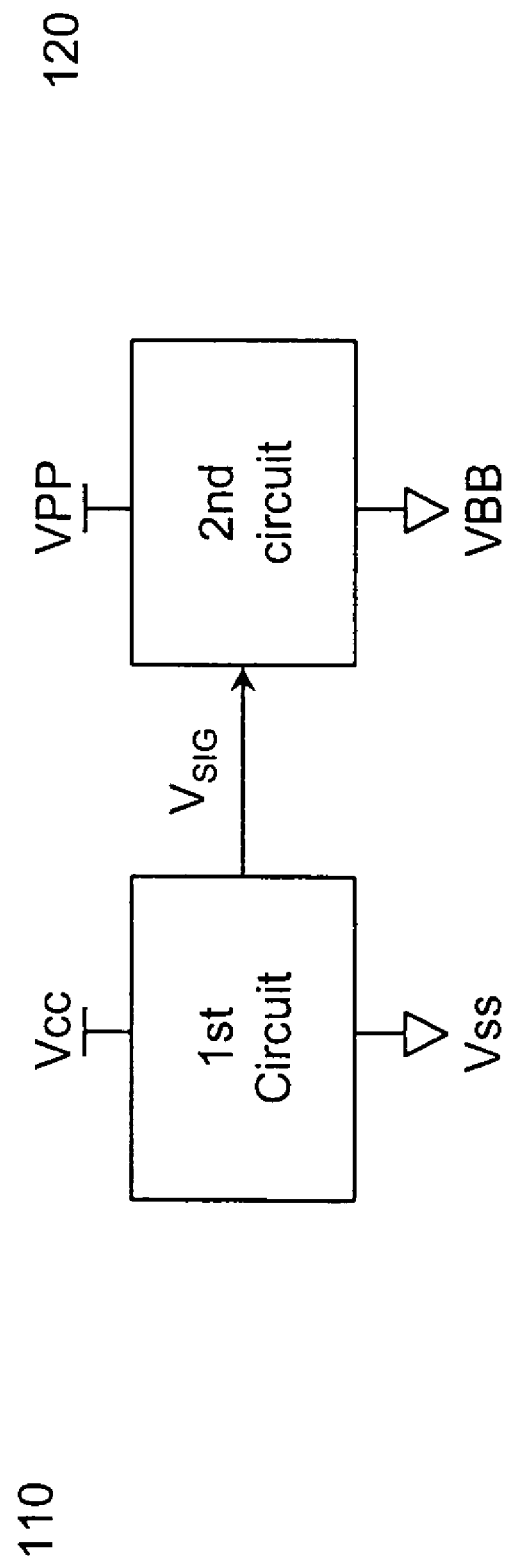
FIG. 1 shows an arrangement of two circuits that operate with different supply voltage levels.
Figure 3B:
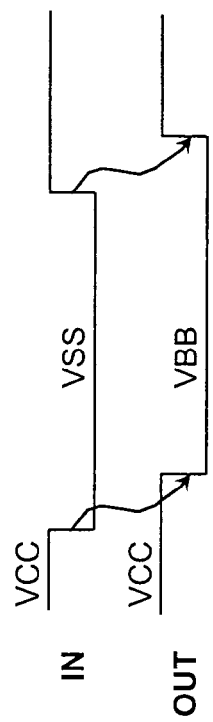
FIG. 3B shows input and output signal waveforms of the level shifter of FIG. 3A.
Figure 3A:
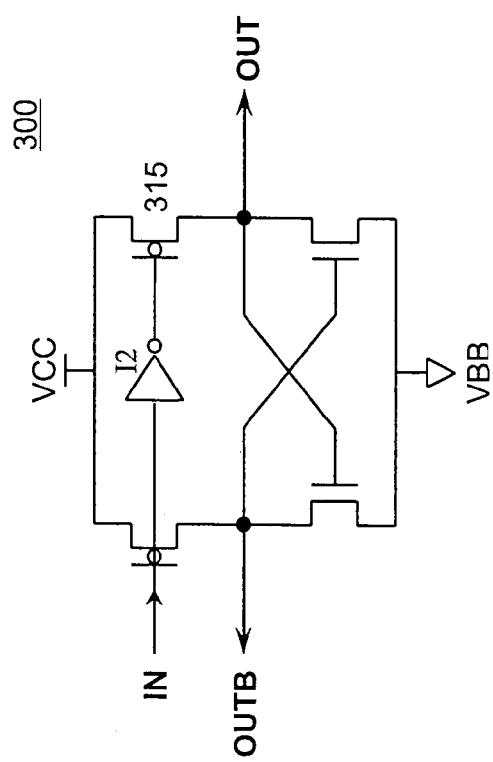
FIG. 3A shows a conventional low level shifter.
Figure 4:
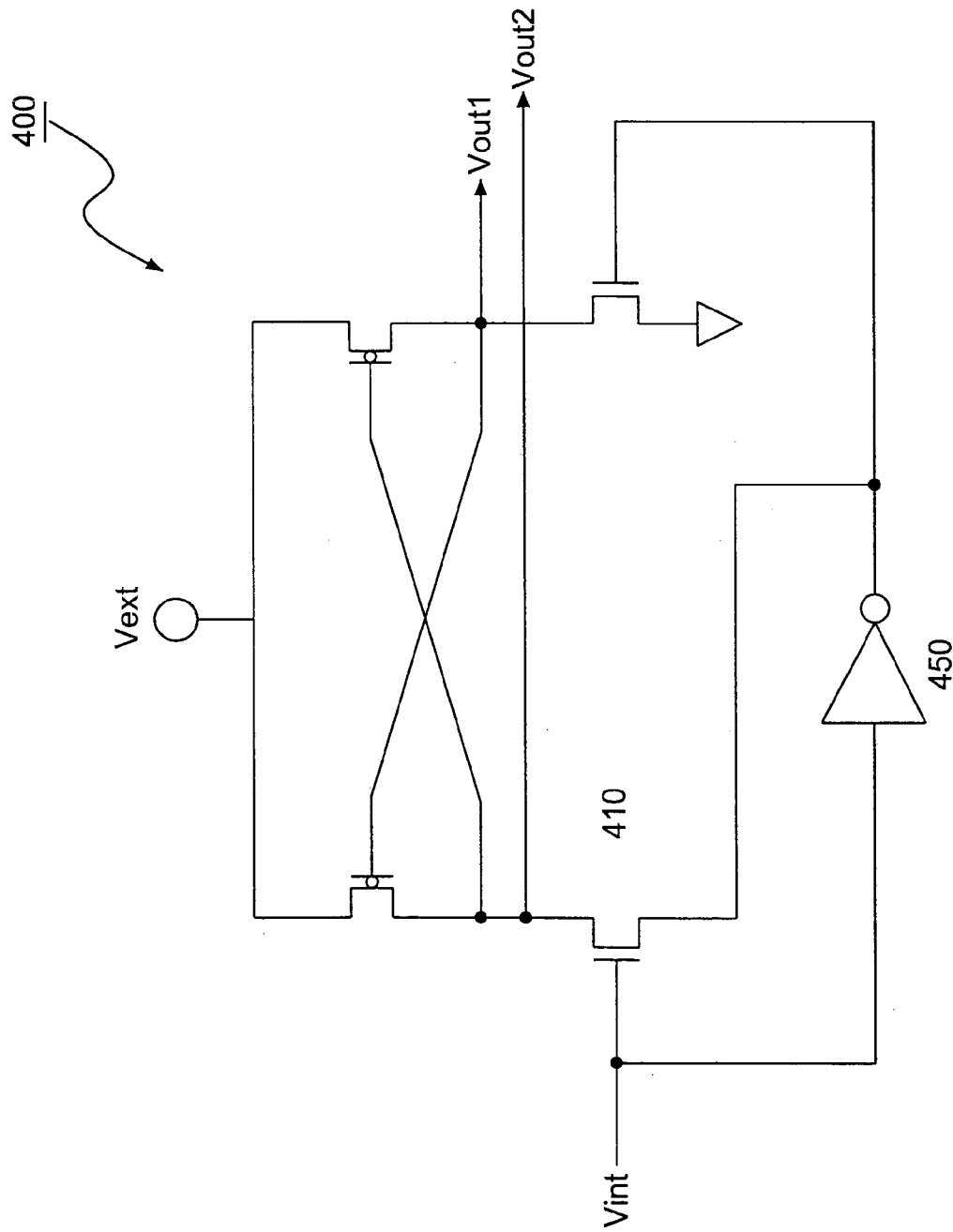
FIG. 4 shows another conventional high level shifter.

Advantageously, the source of pull-up transistor 715 in the level shifter 700 is tied to the input signal IN. Therefore, in the standby mode, when the input signal IN has the low voltage level Vss, the source of pull-up transistor 715 is tied to a lower voltage (e.g., Vss) in comparison to the level shifter 300 of FIG. 3, where the source of the pull-up transistor 315 is tied to VCC. Accordingly, the Vgs of pull-up transistor 715 is substantially positive, thereby substantially reducing the leakage current flowing therethrough in the standby mode compared to the pull-up transistor 315 of FIG. 3.

Figure 8:
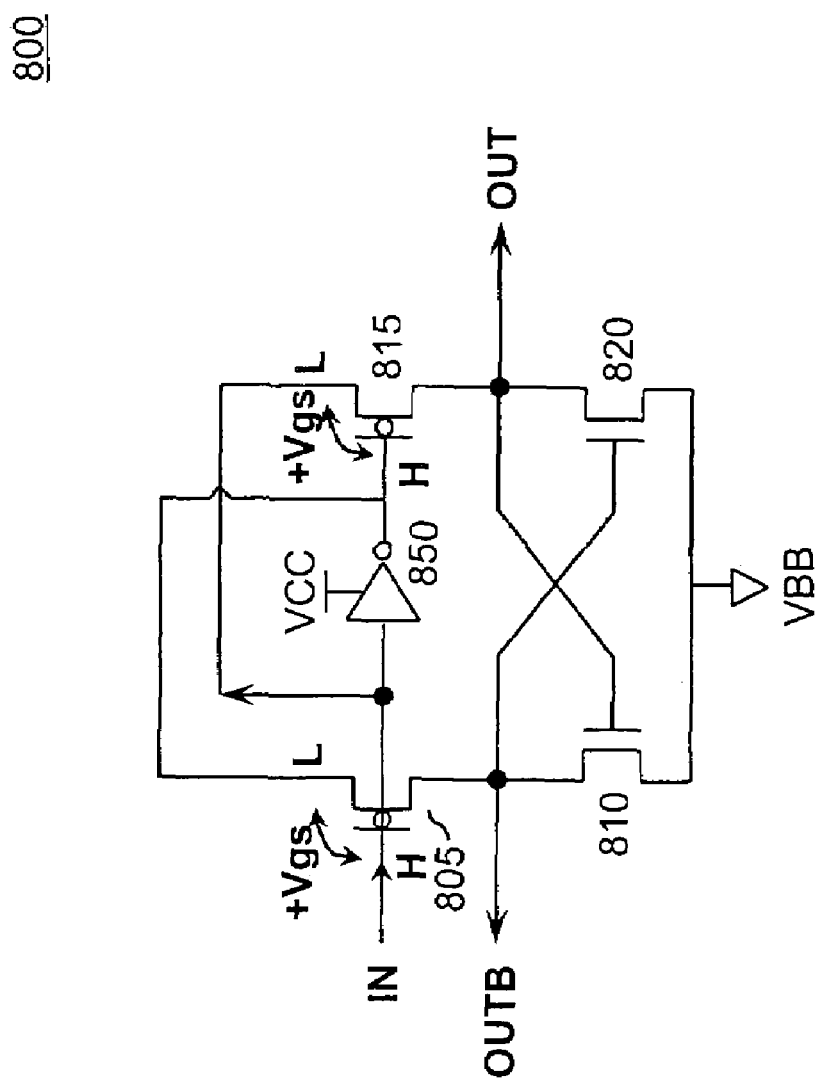
FIG. 8 shows a second embodiment of a one-stage level shifter exhibiting low leakage current.

FIG. 8 shows a second embodiment of a one-stage low level shifter 800. The level shifter 800 receives an input signal IN which has two voltage levels Vcc and Vss and outputs complementary first and second output signals OUT and OUTB having voltage levels Vcc and VBB, where VBB<Vss.

The voltage shifter 800 includes pull-up (PMOS) transistors 805 and 815, pull-down transistors (NMOS) 810 and 820, and inverter 850.

Advantageously, the source of pull-up transistor 815 in the level shifter 800 is tied to the input signal IN. Therefore, in the standby mode, when the input signal IN has the low voltage level Vss, the source of pull-up transistor 815 is tied to a lower voltage (e.g., Vss) in comparison to the level shifter 300 of FIG. 3, where the source of the pull-up transistor 315 is tied to VCC. Accordingly, the Vgs of pull-up transistor 815 is substantially positive, thereby substantially reducing the leakage current flowing therethrough in the standby mode compared to the pull-up transistor 315 of FIG. 3.

Also advantageously, the source of pull-up transistor 805 in the level shifter 800 is tied to the output of inverter 850. Therefore, in the active mode, when the input signal IN has the high voltage level VCC, the source of pull-up transistor 805 is tied to a lower voltage (e.g., VBB) in comparison to the level shifter 300 of FIG. 3, where the source of the pull-up transistor 315 is tied to VCC. Accordingly, the Vgs of pull-up transistor 805 is substantially positive, thereby substantially reducing the leakage current flowing therethrough in the active mode compared to the pull-up transistor 315 of FIG. 3.

Figure 9:
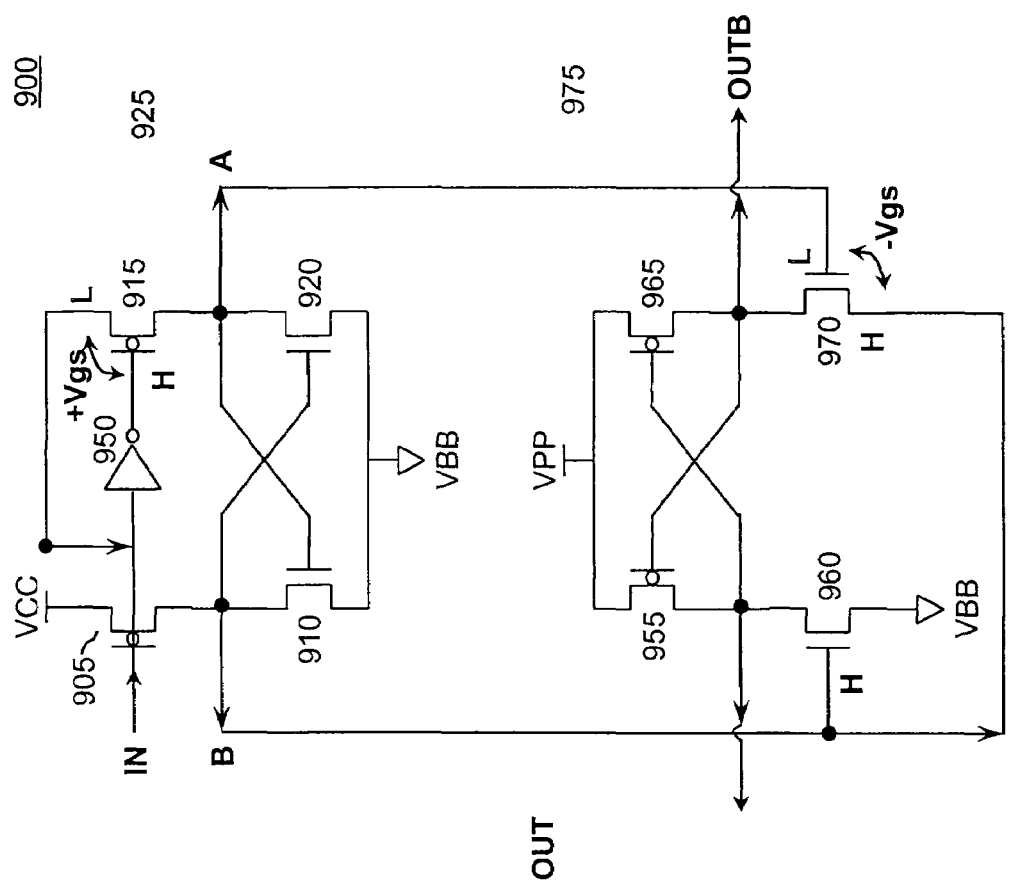
FIG. 9 shows a third embodiment of a two-stage level shifter exhibiting low leakage current.

FIG. 9 shows a third embodiment of a two-stage level shifter 900. The level shifter 900 receives an input signal IN which has two voltage levels Vcc and Vss and outputs complementary first and second output signals OUT and OUTB having voltage levels VPP ($VO_{high}$) and VBB ($VO_{low}$), where: VPP>Vcc; Vcc>Vss; and Vss>VBB.

The level shifter 900 includes a first stage 925 and a second stage 975.

The first stage 925 includes pull-up (PMOS) transistors 905 and 915, pull-down (NMOS) transistors 910 and 920, and inverter 950. Explanation of the various connections between the transistors 905, 910, 915 and 920 and inverter 950 is omitted for brevity as those connections can be easily seen and understood from inspection of FIG. 9. The first stage 925 receives the input signal IN having the two voltage levels Vcc and Vss and outputs complementary first and second intermediate signals A and B having voltage levels Vcc ($VI_{high}$) and VBB ($VI_{low}$).

The second stage 975 includes pull-up (PMOS) transistors 955 and 965, and pull-down (NMOS) transistors 960 and 970. Explanation of the various connections between the transistors 955, 960, 965 and 970 is omitted for brevity as those connections can be easily seen and understood from inspection of FIG. 9. The second stage 975 receives the intermediate signals A and B each of which has the two voltage levels Vcc and VBB, and outputs the complementary first and second output signals OUT and OUTB having voltage levels VPP ($VO_{high}$) and VBB ($VO_{low}$).

In other words, the voltage relationships in the two-stage level shifter 900 are as follows: VPP ($VO_{high}$) >Vcc>Vss>VBB ($VO_{low}$).

The third embodiment of a two-stage level shifter 900 is similar to the two-stage level shifter 500, with the differences being as follows.

First, in place of VBB1 and VBB2 there is only one, single, lower supply voltage, VBB. Accordingly, for example, the source of pull-down transistor 960 is tied to VBB (compared to the pull-down transistor 560 of FIG. 5A, which is tied to VBB2).

Second, the source of pull-up transistor 515 in FIG. 5A is tied to VCC, while the source of pull-up transistor 915 in FIG. 9 is tied to the input signal IN. Therefore, in the standby mode, when the input signal IN has the low voltage level Vss, the source of pull-up transistor 915 is tied to a lower voltage (i.e., Vss). Accordingly, the Vgs of pull-up transistor 915 is substantially positive, thereby substantially reducing the leakage current flowing therethrough in the standby mode.

Third, the source of pull-down transistor 570 in FIG. 5A is tied to VBB2, while the source of pull-down transistor 970 in FIG. 9 is tied to the inverted intermediate signal B. Therefore, in the standby mode, when the input signal IN has the low voltage level Vss, the source of pull-down transistor 970 is tied to a higher voltage (e.g., Vcc). Accordingly, the Vgs of pull-down transistor 970 is substantially negative, thereby achieving a substantially low leakage current flowing therethrough in the standby mode.

Figure 10:
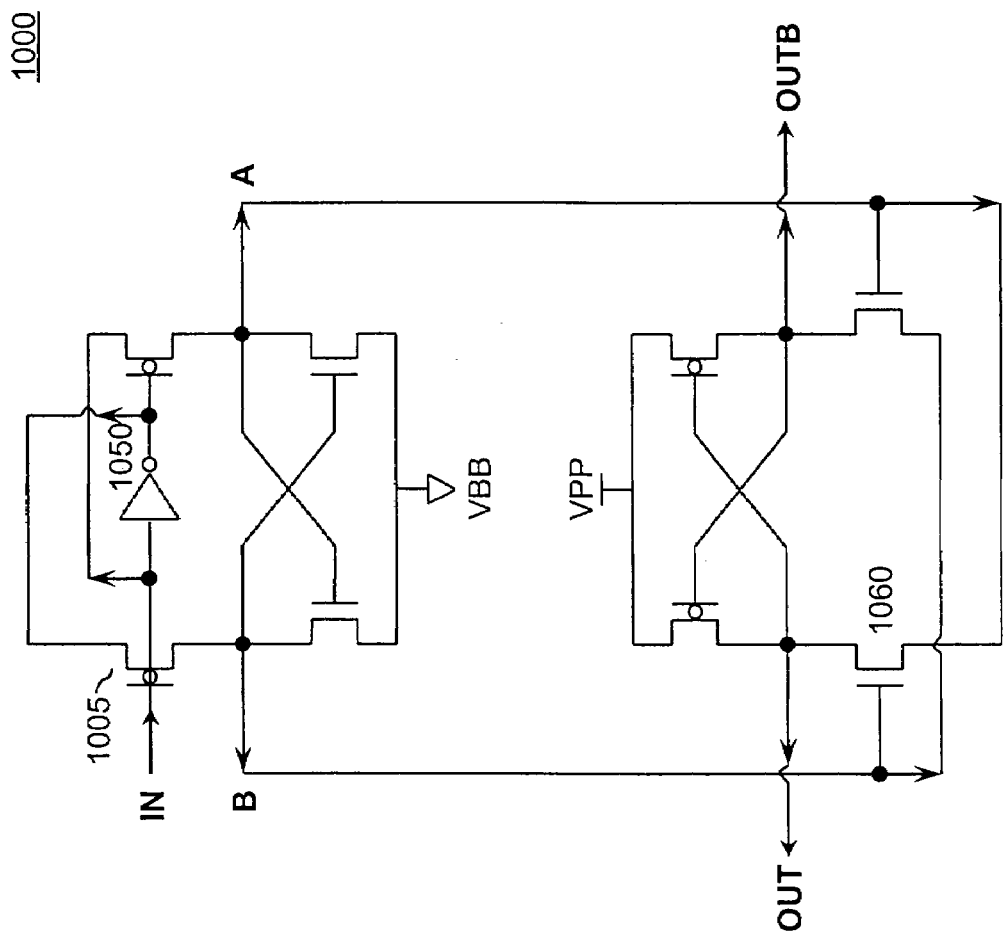
FIG. 10 shows a fourth embodiment of a two-stage level shifter exhibiting low leakage current.

FIG. 10 shows a fourth embodiment of a two-stage level shifter 1000. The level shifter 1000 receives an input signal IN which has two voltage levels Vcc and Vss and outputs complementary first and second output signals OUT and OUTB having voltage levels VPP ($VO_{high}$) and VBB ($VO_{low}$), where: VPP>Vcc; Vcc>Vss; and Vss>VBB.

The fourth embodiment of a two-stage level shifter 1000 is similar to the two-stage level shifter 900, with the differences being as follows.

First, the source of pull-up transistor 905 in FIG. 9 is tied to Vcc, while the source of pull-up (PMOS) transistor 1005 in FIG. 10 is tied to the output of inverter 1050. Therefore, in the active mode, when the input signal IN has the high voltage level Vcc, the source of pull-up transistor 1005 is tied to a lower voltage (e.g., Vss). Accordingly, the Vgs of pull-up transistor 1005 is substantially positive, thereby achieving a substantially low leakage current flowing therethrough in the active mode.

Second, the source of pull-down transistor 960 in FIG. 9 is tied to VBB, while the source of pull-down (NMOS) transistor 1060 in FIG. 10 is tied to the intermediate signal A. Therefore, in the active mode, when the input signal IN has the high voltage level Vcc, the source of pull-down transistor 1060 is tied to a higher voltage (e.g., Vcc). Accordingly, the Vgs of pull-down transistor 1060 is substantially negative, thereby achieving a substantially low leakage current flowing therethrough in the active mode.

Figure 11:
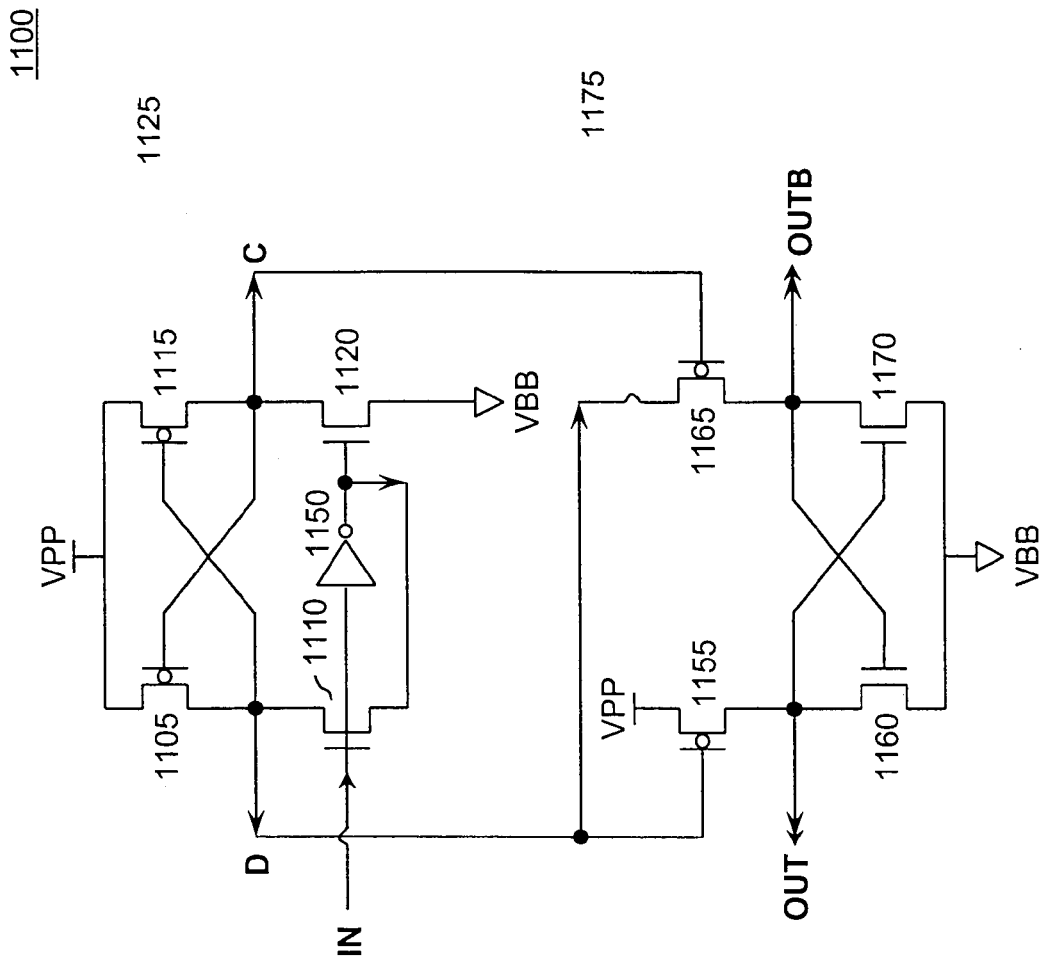
FIG. 11 shows a fifth embodiment of a two-stage level shifter exhibiting low leakage current.

FIG. 11 shows a fifth embodiment of a two-stage level shifter 1100. The level shifter 1100 receives an input signal IN which has two voltage levels Vcc and Vss and outputs complementary first and second output signals OUT and OUTB having voltage levels VPP ($VO_{high}$) and VBB ($VO_{low}$), where: VPP>Vcc; Vcc>Vss; and Vss>VBB.

The level shifter 1100 includes a first stage 1125 and a second stage 1175.

The first stage 1125 includes pull-up (PMOS) transistors 1105 and 1115, pull-down transistors (NMOS) 1110 and 1120, and inverter 1150. Explanation of the various connections between the transistors 1105, 1110, 1115 and 1120 and inverter 1150 is omitted for brevity as those connections can be easily seen and understood from inspection of FIG. 11. The first stage 1125 receives the input signal IN having the two voltage levels Vcc and Vss and outputs complementary first and second intermediate signals A and B having voltage levels VPP ($VI_{high}$) and VBB ($VI_{low}$)

The second stage 1175 includes pull-up (PMOS) transistors 1155 and 1165, and pull-down (NMOS) transistors 1160 and 1170. Explanation of the various connections between the transistors 1155, 1160, 1165 and 1170 is omitted for brevity as those connections can be easily seen and understood from inspection of FIG. 11. The second stage 1175 receives the intermediate signals A and B each of which has the two voltage levels VPP and VBB, and outputs the complementary first and second output signals OUT and OUTB having voltage levels VPP ($VO_{high}$) and VBB ($VO_{low}$).

In other words, the voltage relationships in the two-stage level shifter 1100 are as follows: VPP ($VO_{high}$) >Vcc>Vss>VBB ($VO_{low}$).

The fifth embodiment of a two-stage level shifter 1100 is similar to the two-stage level shifter 600, with the differences being as follows.

First, in place of VPP1 and VPP2 there is only one, single, upper supply voltage, VPP. Accordingly, for example, the source of pull-up transistor 1155 is tied to VPP (compared to the pull-up transistor 655 of FIG. 6A, which is tied to VPP2).

Second, the source of pull-down transistor 610 in FIG. 6 is tied to Vss, while the source of pull-down transistor 1110 in FIG. 11 is tied to the output of inverter 1150. Therefore, in the standby mode, when the input signal IN has the low voltage level Vss, the source of pull-down transistor 1110 is tied to a higher voltage (e.g., VPP). Accordingly, the Vgs of pull-down transistor 1110 is substantially negative, thereby substantially reducing the leakage current flowing therethrough in the standby mode.

Third, the source of pull-up transistor 665 in FIG. 6A is tied to VPP2, while the source of pull-up transistor 1165 in FIG. 11 is tied to the inverted intermediate signal D. Therefore, in the active mode, when the input signal IN has the high voltage level Vcc, the source of pull-up transistor 1165 is tied to a lower voltage (e.g., VBB). Accordingly, the Vgs of pull-up transistor 1105 is substantially positive, thereby achieving a substantially low leakage current flowing therethrough in the active mode.

Figure 12:
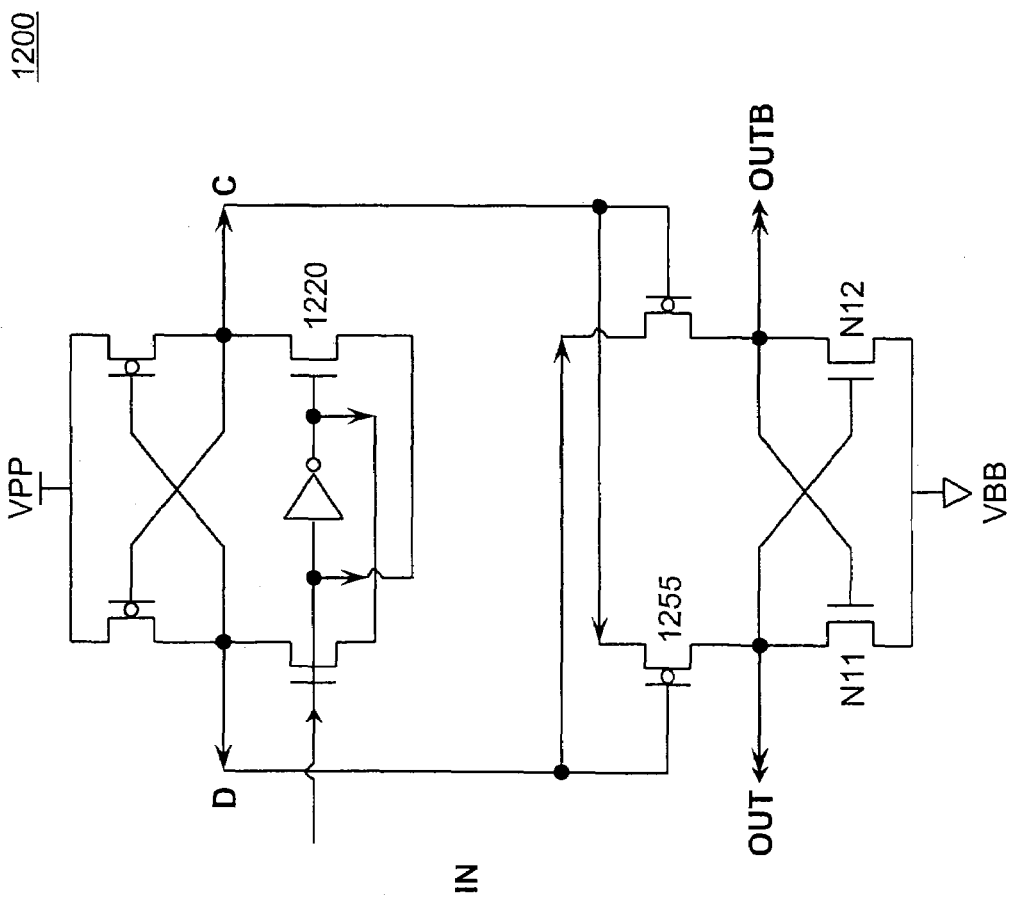
FIG. 12 shows a sixth embodiment of a two-stage level shifter exhibiting low leakage current.

FIG. 12 shows a sixth embodiment of a two-stage level shifter 1200. The level shifter 1200 receives an input signal IN which has two voltage levels Vcc and Vss and outputs complementary first and second output signals OUT and OUTB having voltage levels VPP ($VO_{high}$) and VBB ($VO_{low}$), where: VPP>Vcc; Vcc>Vss; and Vss>VBB.

The sixth embodiment of a two-stage level shifter 1200 is similar to the two-stage level shifter 1100, with the differences being as follows.

First, the source of pull-down transistor 1120 in FIG. 11 is tied to VBB, while the source of pull-down (NMOS) transistor 1220 in FIG. 12 is tied to the input signal IN. Therefore, in the active mode, when the input signal IN has the high voltage level VCC, the source of pull-down transistor 1220 is tied to a higher voltage (e.g., VCC). Accordingly, the Vgs of pull-down transistor 1220 is substantially negative, thereby achieving a substantially low leakage current flowing therethrough in the active mode.

Second, the source of pull-up transistor 1155 in FIG. 11 is tied to VPP, while the source of pull-up (PMOS) transistor 1255 in FIG. 12 is tied to the intermediate signal C. Therefore, in the passive mode, when the input signal IN has the low voltage level Vss, the source of pull-up transistor 1255 is tied to a lower voltage (e.g., Vss). Accordingly, the Vgs of pull-up transistor 1255 is substantially positive, thereby achieving a substantially low leakage current flowing therethrough in the passive mode.

Figure 13:
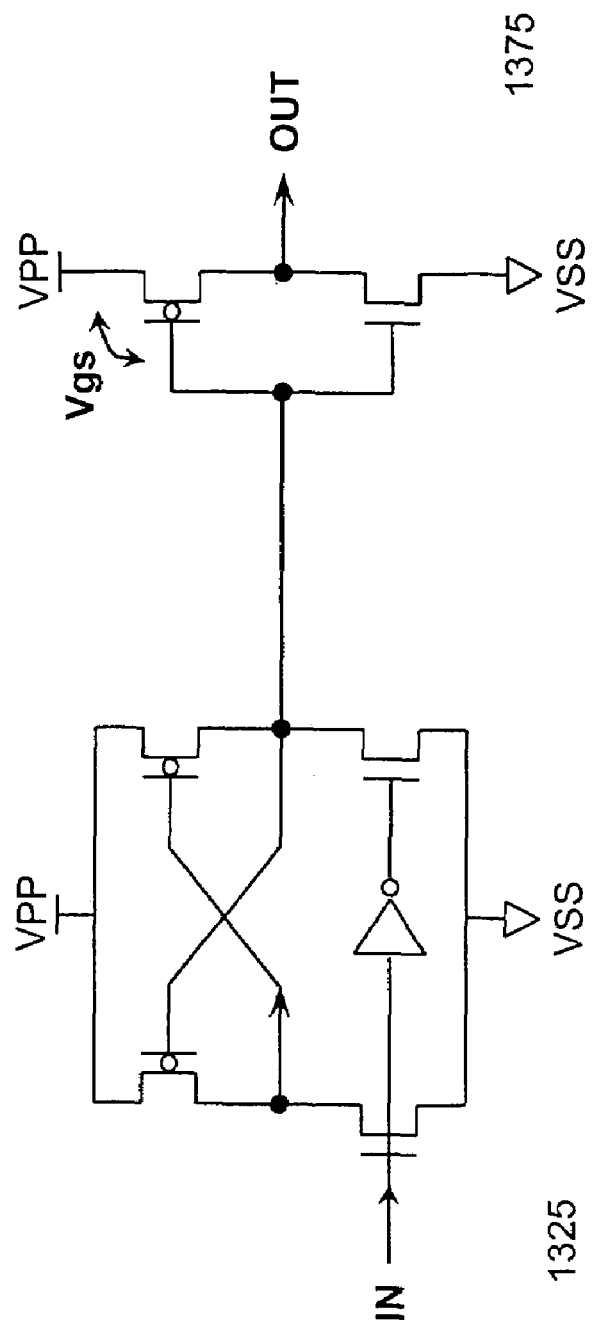
FIG. 13 shows a conventional arrangement including a level shifter and a subsequent circuit.

FIG. 13 shows a conventional arrangement including a level shifter 1325 and a subsequent circuit 1375. In the example of FIG. 13, both the level shifter 1325 and the subsequent circuit 1375 operate with an upper voltage level VPP and a lower voltage level Vss.

Figure 14:
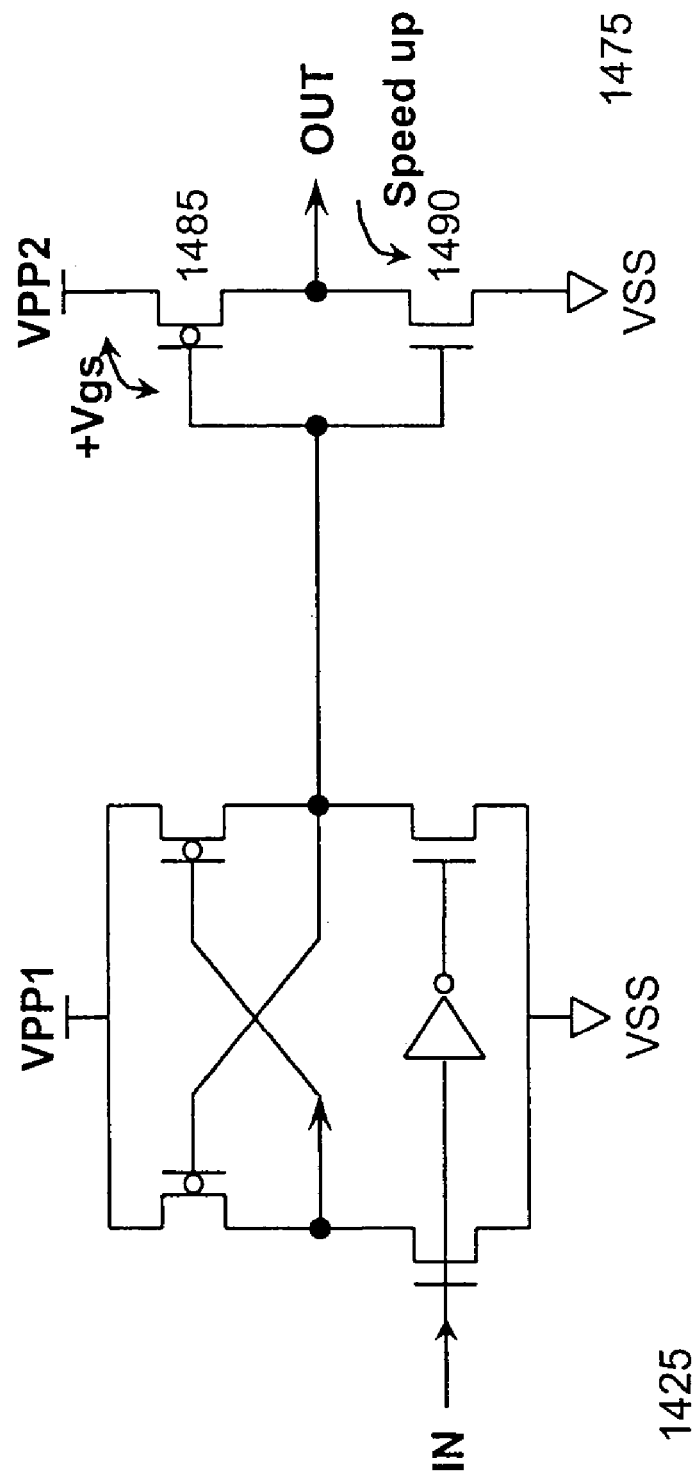
FIG. 14 shows a first embodiment of an arrangement including a level shifter having low leakage current and a subsequent circuit.

FIG. 14 shows a first embodiment of an arrangement including a level shifter 1425 having low leakage current, and a subsequent circuit 1475 (e.g., an isolation circuit).

The level shifter 1425 operates with an upper voltage level, VPP1 that is greater than the upper voltage level, VPP2, of the subsequent circuit 1475. Therefore, in an active mode, when the input signal IN has the high voltage level VCC, the gates of transistors 1485 and 1490 are both tied to a higher voltage (e.g., VPP1).

This produces two beneficial effects. First, in the active mode, the Vgs of PMOS transistor 1485 is substantially positive, thereby achieving a substantially low leakage current flowing therethrough. Second, in the active mode, the higher gate voltage on NMOS transistor 1490 causes it to turn on more rapidly, improving the speed of the circuit.

Figure 15:
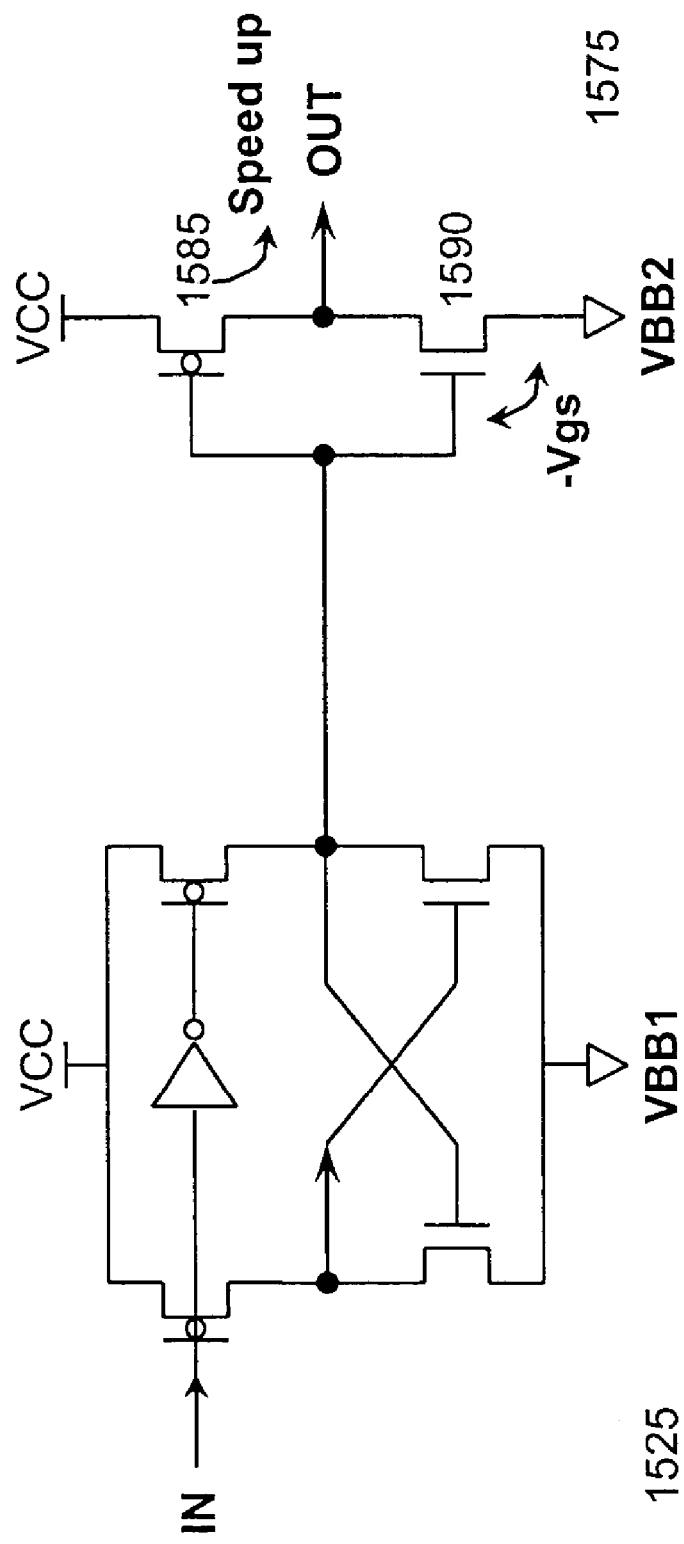
FIG. 15 shows a second embodiment of an arrangement including a level shifter having low leakage current and a subsequent circuit.

FIG. 15 shows a second embodiment of an arrangement including a level shifter 1525 having low leakage current, and a subsequent circuit 1575 (e.g., an isolation circuit).

The level shifter 1525 operates with a lower voltage level, VBB1 that is less than the lower voltage level, VBB2, of the subsequent circuit 1575. Therefore, in a passive mode, when the input signal IN has the low voltage level Vss, the gates of transistors 1585 and 1590 are both tied to a lower voltage (e.g., VBB1).

This produces two beneficial effects. First, in the passive mode, the Vgs of NMOS transistor 1590 is substantially negative, thereby achieving a substantially low leakage current flowing therethrough. Second, in the passive mode, the lower gate voltage on PMOS transistor 1585 causes it to turn on more rapidly, improving the speed of the circuit.

Figure 16:
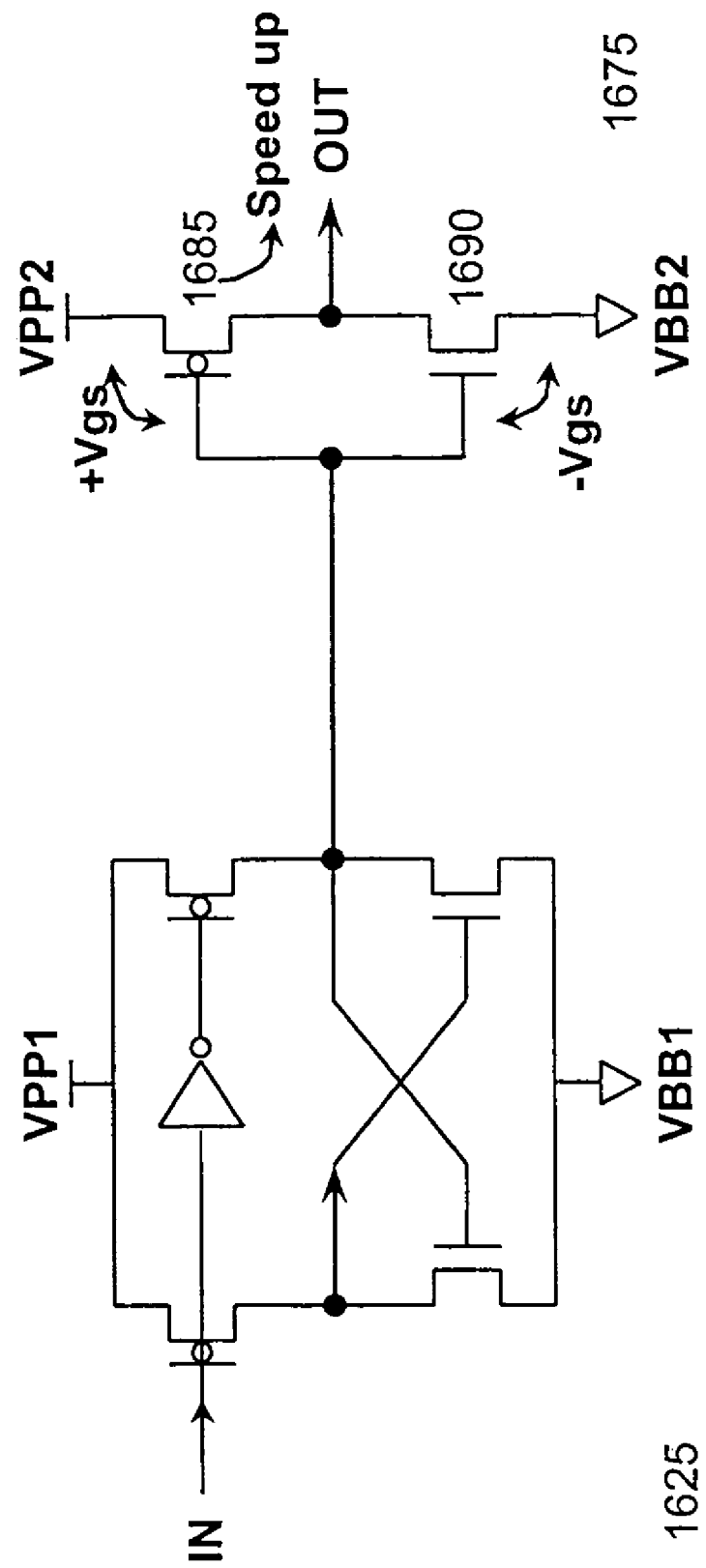
FIG. 16 shows a third embodiment of an arrangement including a level shifter having low leakage current and a subsequent circuit.

FIG. 16 shows a third embodiment of an arrangement including a level shifter 1625 having low leakage current, and a subsequent circuit 1675 (e.g., an isolation circuit).

The level shifter 1625 operates with an upper voltage level, VPP1 that is greater than the upper voltage level, VPP2, of the subsequent circuit 1675, and a lower voltage level, VBB1 that is less than the lower voltage level, VBB2, of the subsequent circuit 1675. Therefore, in an active mode, when the input signal IN has the high voltage level Vcc, the gates of transistors 1685 and 1690 are both tied to a higher voltage (e.g., VPP1). Meanwhile, in a passive mode, when the input signal IN has the low voltage level Vss, the gates of transistors 1685 and 1690 are both tied to a lower voltage (e.g., VBB1).

This produces several beneficial effects. First, in the active mode, the Vgs of transistor PMOS 1685 is substantially positive, thereby achieving a substantially low leakage current flowing therethrough. Second, in the active mode, the higher gate voltage on NMOS transistor 1690 causes it to turn on more rapidly, improving the speed of the circuit. Third, in the passive mode, the Vgs of transistor 1690 is substantially negative, thereby achieving a substantially low leakage current flowing therethrough. Fourth, in the passive mode, the lower gate voltage on transistor 1685 causes it to turn on more rapidly, improving the speed of the circuit.

Figure 17:
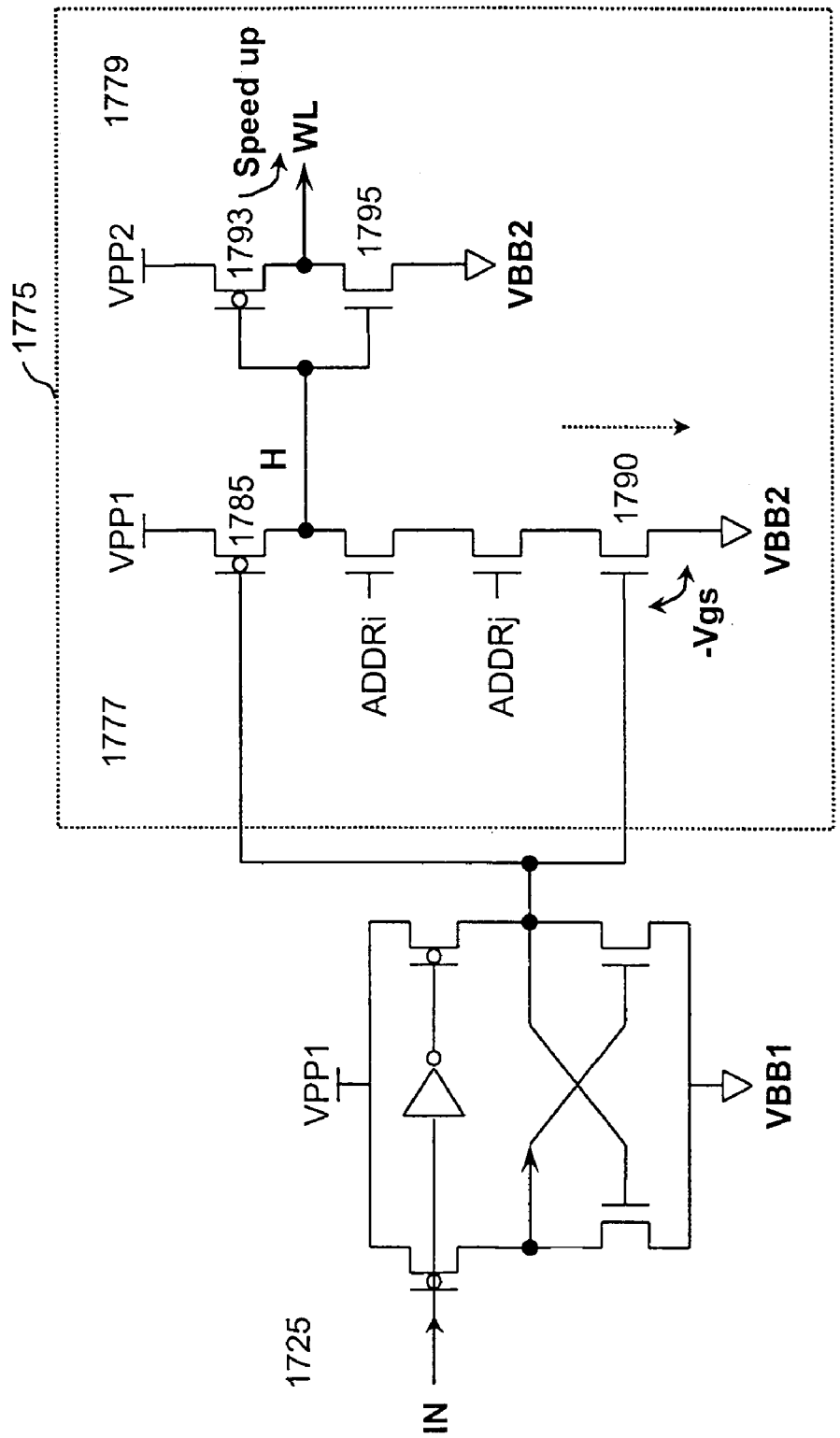
FIG. 17 shows a fourth embodiment of an arrangement including a level shifter having low leakage current and a subsequent circuit.

FIG. 17 shows a fourth embodiment of an arrangement including a level shifter 1725 having low leakage current, and a subsequent circuit 1775 (e.g., word line decoder/driver circuit).

The level shifter 1725 operates with a lower voltage level, VBB1 that is less than the lower voltage level, VBB2, of the first stage 1777 of the subsequent circuit 1775. Meanwhile, the first stage 1777 of the subsequent circuit 1775 operates with an upper voltage level, VPP1 that is higher than the upper voltage level, VPP2, of the second stage 1779.

Therefore, in a passive mode, when the input signal IN has the low voltage level Vss, the gates of transistors 1785 and 1790 are both tied to a lower voltage (e.g., VBB1). Meanwhile, the gates of transistors 1793 and 1795 of the second stage 1779 are both tied to a higher voltage (e.g., VPP1) than the upper supply voltage VBB2.

This produces several beneficial effects. First, in the passive mode, the Vgs of transistor NMOS 1790 is substantially negative, thereby achieving a substantially low leakage current flowing therethrough. Second, in the passive mode, the lower gate voltage on PMOS transistor 1785 causes it to turn on more rapidly, improving the speed of the circuit. Third, in the passive mode, the higher voltage on the gate of PMOS transistor 1793 makes the Vgs of transistor 1793 substantially positive, thereby achieving a substantially low leakage current flowing therethrough. Fourth, in the passive mode, the higher voltage on the gate of NMOS transistor 1795 causes it to turn on more rapidly, improving the speed of the circuit.

While preferred embodiments are disclosed herein, many variations are possible which remain within the concept and scope of the invention. For example, although FIG. 6 shows the source of pull-up transistor 615 being connected to the gate of pull-up transistor 605, it is also possible to connect the source of pull-up transistor 615 to the upper supply voltage Vcc. Such variations would become clear to one of ordinary skill in the art after inspection of the specification, drawings and claims herein. The invention therefore is not to be restricted except within the spirit and scope of the appended claims.

What is claimed is:

1. A voltage level shift circuit, comprising:
   a first stage which receives an input signal having voltage levels Vcc and Vss, where Vcc>Vss, and which outputs complementary first and second intermediate signals, wherein the complementary first and second intermediate signals have voltage levels $VI_{high}$ and $VI_{low}$, where $VI_{high}$>$VI_{low}$; and
   a second stage which receives the first and second intermediate signals, and which outputs complementary first and second output signals, wherein the complementary first and second output signals have voltage levels $VO_{high}$ and $VO_{low}$, where $VO_{high}$>$VO_{low}$, wherein $VI_{high}$>$VO_{high}$ or $VI_{low}$<$VO_{low}$, and wherein $VO_{high}$>Vcc and $VO_{low}$<Vss.

2. The circuit of claim 1, wherein $VI_{high}$=Vcc, and wherein $VI_{low}$<$VO_{low}$.

3. The circuit of claim 2, wherein the second stage comprises:
   a first NMOS transistor having a gate which receives the first intermediate signal, and having a source connected to a reference potential of $VO_{low}$;
   a second NMOS transistor having a gate which receives the second intermediate signal, and having a source connected to the reference potential of $VO_{low}$;
   a first PMOS transistor having a gate connected to the drain of the second NMOS transistor, a source connected to a second reference potential of $VO_{high}$, and a drain connected to the drain of the first NMOS transistor; and
   a second PMOS transistor having a gate connected to the drain of the first NMOS transistor, a source connected to the second reference potential of $VO_{High}$, and a drain connected to the drain of the second NMOS transistor.

4. The circuit of claim 3, wherein the first stage comprises:
- a third PMOS transistor having a gate which receives the input signal, a source connected to a third reference potential of $VI_{high}$, and a drain connected to the gate of the second NMOS transistor;
- an inverter having an input connected to the gate of the third PMOS transistor;
- a fourth PMOS transistor having a gate connected an output of the inverter, a source connected to the third reference potential of $VI_{high}$, and a drain connected to the gate of the first NMOS transistor;
- a third NMOS transistor having a gate connected to the drain of the fourth PMOS transistor, having a source connected to a fourth reference potential of $VI_{low}$, and having a drain connected to the drain of the third PMOS transistor; and
- a fourth NMOS transistor having a gate connected to the drain of the third PMOS transistor, and having a source connected to the fourth reference potential of $VI_{low}$, and having a drain connected to the drain of the fourth PMOS transistor.

5. The circuit of claim 1, wherein $VI_{low}=Vss$, and wherein $VI_{high}>VO_{high}$.

6. The circuit of claim 5, wherein the second stage comprises:
- a first PMOS transistor having a gate which receives the first intermediate signal, and having a source connected to a reference potential of $VO_{high}$;
- a second PMOS transistor having a gate which receives the second intermediate signal, and having a source connected to the reference potential of $VO_{high}$; a first NMOS transistor having a gate connected to the drain of the second PMOS transistor, a source connected to a second reference potential of $VO_{low}$, and a drain connected to the drain of the first PMOS transistor; and
- a second NMOS transistor having a gate connected to the drain of the first PMOS transistor, a source connected to the second reference potential of $VO_{low}$, and a drain connected to the drain of the second PMOS transistor.

7. The circuit of claim 6, wherein the first stage comprises:
- a third NMOS transistor having a gate which receives the input signal, a source connected to a third reference potential of $VI_{low}$, and a drain connected to the gate of the second PMOS transistor;
- an inverter having an input connected to the gate of the third NMOS transistor;
- a fourth NMOS transistor having a gate connected an output of the inverter, a source connected to the third reference potential of $VI_{low}$, and a drain connected to the gate of the first PMOS transistor;
- a third PMOS transistor having a gate connected to the drain of the fourth PMOS transistor, having a source connected to a fourth reference potential of $VI_{high}$, and having a drain connected to the drain of the third NMOS transistor; and
- a fourth PMOS transistor having a gate connected to the drain of the third NMOS transistor, and having a source connected to the fourth reference potential of $VI_{high}$, and having a drain connected to the drain of the fourth NMOS transistor.

8. A circuit, comprising:
- a first voltage level shift circuit which receives an input signal having voltage levels Vcc and Vss, where Vcc>Vss, and which outputs an intermediate signal having voltage levels $VI_{high}$ and $VI_{low}$, where $VI_{high}>VI_{low}$; and
- a second voltage level shift circuit which receives the intermediate signal from the first voltage level shift circuit, and which outputs an output signal having voltage levels $VO_{high}$ and $VO_{low}$, where $VO_{high}>Vcc$, and $Vss>VO_{low}$,
- wherein at least one of (a) $VI_{high}>VO_{high}$, and (b) $VI_{low}<VO_{low}$.

9. The circuit of claim 8, wherein the second voltage level shift circuit is an inverter.

10. A circuit, comprising:
- a first voltage level shift circuit which receives an input signal having voltage levels Vcc and Vss, where Vcc>Vss, and which outputs an intermediate signal having voltage levels $VI_{high}$ and $VI_{low}$, where $VI_{high}>VI_{low}$; and
- a second voltage level shift circuit which receives the intermediate signal from the first voltage level shift circuit, and which outputs an output signal having voltage levels $VO_{high}$ and $VO_{low}$, where $V0_{high}>VO_{low}$,
- wherein the second voltage level shift circuit is an inverter, and
- wherein $VI_{low}<VO_{low}$, and wherein $VI_{high}=VO_{high}=Vcc$.

11. The circuit of claim 10, wherein $VI_{high}>VO_{high}$.

12. A circuit, comprising:
- a first voltage level shift circuit which receives an input signal having voltage levels Vcc and Vss, where Vcc>Vss, and which outputs an intermediate signal having voltage levels $VI_{high}$ and $VI_{low}$, where $VI_{high}>VI_{low}$;and
- a second voltage level shift circuit which receives the intermediate signal from the first voltage level shift circuit, and which outputs an output signal having voltage levels $VO_{high}$ and $VO_{low}$, where $VO_{high}>VO_{low}$,
- wherein the second voltage level shift circuit is an inverter which comprises:
- a first NMOS transistor having a gate which receives the first intermediate signal, and having a source connected to a first reference potential of $VO_{low}$; and
- a first PMOS transistor having a gate which receives the first intermediate signal, and having a source connected to a second reference potential of $VO_{high}$, and a drain connected to the drain of the first NMOS transistor.

13. The circuit of claim 12, wherein the first first voltage level shift circuit comprises:
- a second PMOS transistor having a gate which receives the input signal, and a source connected to a third reference potential of $VI_{high}$;
- an inverter having an input connected to the gate of the second PMOS transistor;
- a third PMOS transistor having a gate connected an output of the inverter, a source connected to the third reference potential of $VI_{high}$, and a drain connected to the gate of the first NMOS transistor and the gate of the first PMOS transistor;
- a second NMOS transistor having a gate connected to the drain of the third PMOS transistor, having a source connected to a fourth reference potential of $VI_{low}$, and having a drain connected to the drain of the second PMOS transistor; and
- a third NMOS transistor having a gate connected to the drain of the second PMOS transistor, and having a source connected to the fourth reference potential of $VI_{low}$, and having a drain connected to the drain of the third PMOS transistor.

14. A circuit, comprising:
a first voltage level shift circuit which receives an input signal having voltage levels Vcc and Vss, where Vcc>Vss, and which outputs an intermediate signal having voltage levels $VI_{high}$ and $VI_{low}$, where $VI_{high}$>$VI_{low}$; and
a second voltage level shift circuit which receives the intermediate signal from the first voltage level shift circuit, and which outputs an output signal having voltage levels $VO_{high}$ and $VO_{low}$, where $VO_{high}$>$VO_{low}$, wherein at least one of (a) $VI_{high}$>$VO_{high}$, and (b) $VI_{low}$<$VO_{low}$, and
wherein the second voltage level shift circuit is a word line decoder for a memory circuit.

15. The circuit of claim 14, further comprising a word line driver coupled to an output of the word line decoder.

16. The circuit of claim 14, wherein the word line decoder comprises:
a first NMOS transistor having a gate which receives the first intermediate signal, and having a source connected to a first reference potential of $VO_{low}$;
a first PMOS transistor having a gate which receives the first intermediate signal, and having a source connected to a second reference potential of $VI_{high}$;
second and third NMOS transistors connected between the drain of the first NMOS transistor and the drain of the first PMOS transistor, each of the second and third NMOS transistors receiving a corresponding address line of the memory circuit.

17. The circuit of claim 16, wherein the first stage comprises:
a second PMOS transistor having a gate which receives the input signal, and a source connected to the second reference potential of $VI_{high}$;
an inverter having an input connected to the gate of the second PMOS transistor;
a third PMOS transistor having a gate connected an output of the inverter, a source connected to the third reference potential of $VI_{high}$, and a drain connected to the gate of the first NMOS transistor and the gate of the first PMOS transistor;
a fifth NMOS transistor having a gate connected to the drain of the third PMOS transistor, having a source connected to a third reference potential of $VI_{low}$, and having a drain connected to the drain of the second PMOS transistor; and
a sixth NMOS transistor having a gate connected to the drain of the second PMOS transistor, and having a source connected to the third reference potential of $VI_{low}$, and having a drain connected to the drain of the third PMOS transistor.

18. The circuit of claim 17, further comprising a word line driver coupled to an output of the word line decoder.

19. The circuit of claim 18, wherein the word line driver comprises:
a seventh NMOS transistor having a gate which is connected to the drain of the first PMOS transistor, and having a source connected to the first reference potential of $VO_{low}$; and
a fourth PMOS transistor having a gate which is connected to the drain of the first PMOS transistor, a source connected to a fourth reference potential of $VO_{high}$, and a drain connected to the drain of the first NMOS transistor.

20. A method of level shifting an input signal, comprising:
receiving at a first stage of a level shift circuit an input signal having voltage levels Vcc and Vss, where Vcc>Vss;
outputting from the first stage complementary first and second intermediate signals, wherein the complementary first and second intermediate signals have voltage levels $VI_{high}$ and $VI_{low}$, where $VI_{high}$>$VI_{low}$; and
receiving at a second stage of the level shift circuit the first and second intermediate signals; and
outputting from the second stage complementary first and second output signals, wherein the complementary first and second output signals have voltage levels $VO_{high}$ and $VO_{low}$, where $VO_{high}$>$VO_{low}$, wherein $VI_{high}$>$VO_{high}$ or $VI_{low}$<$VO_{low}$, and wherein $VO_{high}$>Vcc and $VO_{low}$<Vss.

21. A method of generating a word line for a memory circuit, comprising:
receiving at a level shift circuit an input signal having voltage levels Vcc and Vss, where Vcc>Vss;
outputting from the level shift circuit a first intermediate signal, wherein the first intermediate signal has voltage levels $VI_{high}$ and $VI_{low}$, where $VI_{high}$>$VI_{low}$;
receiving at a word line decoder the first intermediate signal;
outputting from the word line decoder a second intermediate signal, wherein the second intermediate signal has voltage levels $VI_{high}$ and $VO_{low}$;
receiving at a word line driver the second intermediate signal;
outputting from the word line driver a word line signal, wherein the word line signal has voltage levels $VO_{high}$ and $VO_{low}$,
where $VO_{high}$>$VO_{low}$, where $VI_{high}$>$VO_{high}$, where $VI_{low}$<$VO_{low}$, and where $VO_{high}$>Vcc and $VO_{low}$<Vss.

* * * * *